(12) United States Patent
Zhou et al.

(10) Patent No.: US 10,217,850 B2
(45) Date of Patent: Feb. 26, 2019

(54) METHOD OF FORMING PAIRS OF THREE-GATE NON-VOLATILE FLASH MEMORY CELLS USING TWO POLYSILICON DEPOSITION STEPS

(71) Applicant: Silicon Storage Technology, Inc., San Jose, CA (US)

(72) Inventors: Feng Zhou, Fremont, CA (US); Xian Liu, Sunnyvale, CA (US); Chien-Sheng Su, Saratoga, CA (US); Nhan Do, Saratoga, CA (US); Chunming Wang, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/474,879

(22) Filed: Mar. 30, 2017

(65) Prior Publication Data

US 2018/0069104 A1    Mar. 8, 2018

(30) Foreign Application Priority Data

Apr. 20, 2016 (CN) .......................... 2016 1 0247666

(51) Int. Cl.
*H01L 29/66* (2006.01)
*H01L 29/788* (2006.01)
(Continued)

(52) U.S. Cl.
CPC .. *H01L 29/66825* (2013.01); *H01L 21/28273* (2013.01); *H01L 27/0705* (2013.01);
(Continued)

(58) Field of Classification Search
CPC ............. H01L 29/66825; H01L 29/788; H01L 29/42328; H01L 29/6653; H01L 29/0847;
(Continued)

(56) References Cited

U.S. PATENT DOCUMENTS

| | | | |
|---|---|---|---|
| 6,338,993 B1 | 1/2002 | Lien | |
| 6,747,310 B2 * | 6/2004 | Fan | H01L 27/11521 257/316 |

(Continued)

FOREIGN PATENT DOCUMENTS

| | | |
|---|---|---|
| TW | 2013 51618 A | 12/2013 |
| TW | 2015 41563 A | 11/2015 |
| TW | 2016 13073 A | 4/2016 |

*Primary Examiner* — Sophia Nguyen
(74) *Attorney, Agent, or Firm* — DLA Piper LLP (US)

(57) ABSTRACT

A simplified method for forming pairs of non-volatile memory cells using two polysilicon depositions. A first polysilicon layer is formed on and insulated from the semiconductor substrate in a first polysilicon deposition process. A pair of spaced apart insulation blocks are formed on the first polysilicon layer. Exposed portions of the first poly silicon layer are removed while maintaining a pair of polysilicon blocks of the first polysilicon layer each disposed under one of the pair of insulation blocks. A second polysilicon layer is formed over the substrate and the pair of insulation blocks in a second polysilicon deposition process. Portions of the second polysilicon layer are removed while maintaining a first polysilicon block (disposed between the pair of insulation blocks), a second polysilicon block (disposed adjacent an outer side of one insulation block), and a third polysilicon block (disposed adjacent an outer side of the other insulation block).

6 Claims, 19 Drawing Sheets

(51) Int. Cl.
*H01L 27/07* (2006.01)
*H01L 29/08* (2006.01)
*H01L 29/423* (2006.01)
*H01L 21/28* (2006.01)

(52) U.S. Cl.
CPC .... *H01L 29/0847* (2013.01); *H01L 29/42328* (2013.01); *H01L 29/6653* (2013.01); *H01L 29/66545* (2013.01); *H01L 29/788* (2013.01); *G11C 2216/10* (2013.01)

(58) Field of Classification Search
CPC ............. H01L 27/0705; H01L 29/7841; C11C 2216/10
See application file for complete search history.

(56) References Cited

U.S. PATENT DOCUMENTS

| | | | |
|---|---|---|---|
| 6,992,929 B2* | 1/2006 | Chen | G11C 16/0483 257/314 |
| 7,315,056 B2 | 1/2008 | Klinger | |
| 7,800,159 B2* | 9/2010 | Widjaja | H01L 27/115 257/315 |
| 8,669,607 B1* | 3/2014 | Tsair | H01L 29/7881 257/316 |
| 9,190,532 B2 | 11/2015 | Wang | |
| 9,306,039 B2 | 4/2016 | Tadayoni | |
| 9,379,121 B1* | 6/2016 | Chen | H01L 27/11521 |
| 9,614,048 B2* | 4/2017 | Wu | H01L 29/42368 |
| 2004/0185615 A1* | 9/2004 | Ding | H01L 27/115 438/257 |
| 2006/0261399 A1* | 11/2006 | Widjaja | G11C 16/0483 257/315 |
| 2007/0194366 A1* | 8/2007 | Kuo | H01L 21/28273 257/314 |
| 2011/0006355 A1* | 1/2011 | Shen | H01L 27/11521 257/316 |
| 2012/0119281 A1* | 5/2012 | Tan | H01L 21/28273 257/315 |
| 2014/0015029 A1* | 1/2014 | Hsu | H01L 21/28273 257/316 |
| 2014/0057422 A1* | 2/2014 | Liu | H01L 21/26586 438/510 |
| 2014/0091382 A1* | 4/2014 | Tadayoni | H01L 21/28273 257/320 |
| 2014/0126299 A1* | 5/2014 | Fukumoto | G11C 16/0416 365/185.33 |
| 2015/0008451 A1* | 1/2015 | Su | H01L 21/82342 257/77 |
| 2015/0014761 A1* | 1/2015 | Hsu | H01L 21/28273 257/316 |
| 2015/0035040 A1* | 2/2015 | Yoo | H01L 29/7881 257/320 |
| 2015/0091073 A1* | 4/2015 | Li | H01L 29/7881 257/316 |
| 2015/0194519 A1* | 7/2015 | Wada | H01L 29/66825 257/315 |
| 2015/0364558 A1* | 12/2015 | Wu | H01L 29/42368 257/316 |
| 2015/0372121 A1* | 12/2015 | Chen | H01L 29/66825 257/320 |
| 2016/0126247 A1* | 5/2016 | Kim | H01L 29/0688 257/315 |
| 2016/0141296 A1* | 5/2016 | Yang | H01L 27/11521 257/316 |
| 2016/0141407 A1* | 5/2016 | Chiba | H01L 23/528 257/316 |
| 2016/0163722 A1* | 6/2016 | Chang | H01L 27/11521 257/316 |
| 2016/0204274 A1* | 7/2016 | Fan | H01L 29/66825 257/319 |
| 2016/0217849 A1* | 7/2016 | Do | G11C 16/0458 |
| 2016/0240622 A1* | 8/2016 | Fan | H01L 27/11519 |
| 2017/0025427 A1 | 1/2017 | Su | |
| 2017/0098654 A1* | 4/2017 | Zhou | H01L 21/28273 |
| 2017/0301683 A1* | 10/2017 | Chen | H01L 27/11546 |
| 2018/0069104 A1* | 3/2018 | Zhou | H01L 29/42328 |
| 2018/0102414 A1* | 4/2018 | Liu | H01L 29/42328 |

* cited by examiner

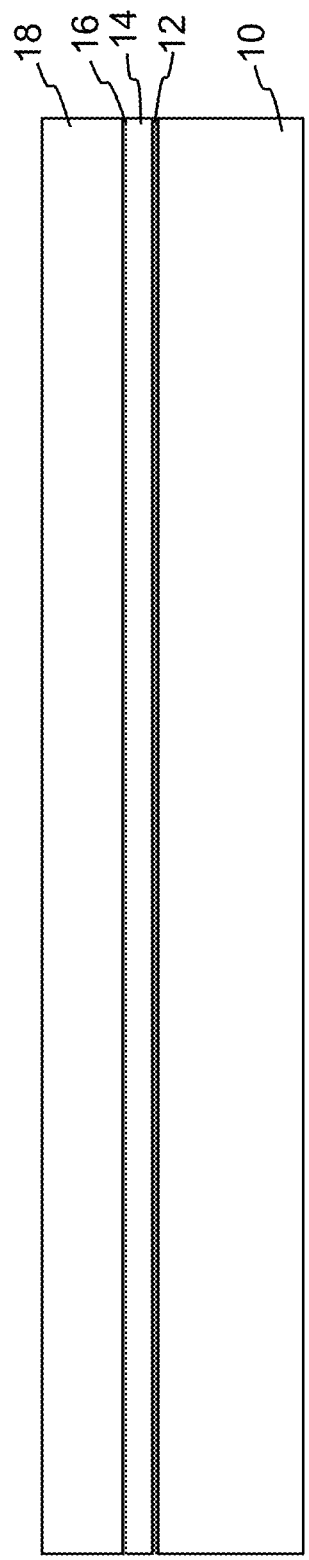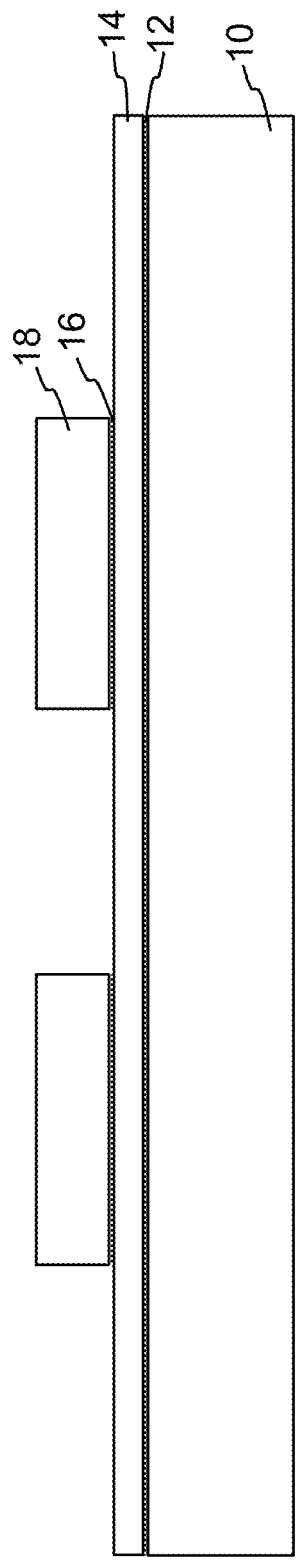

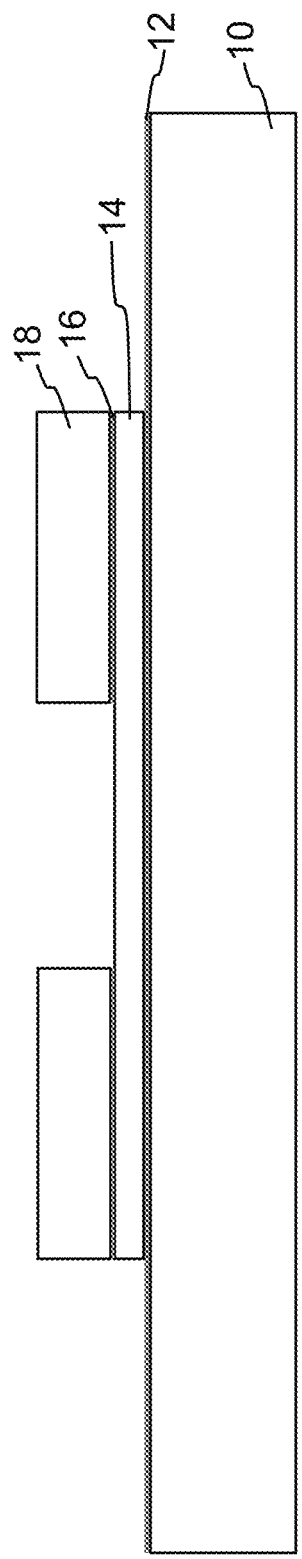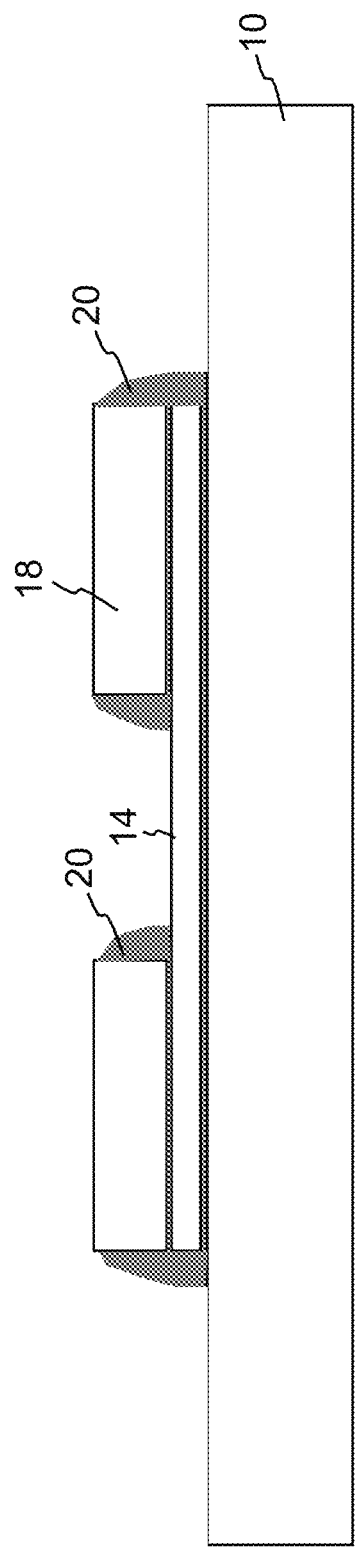

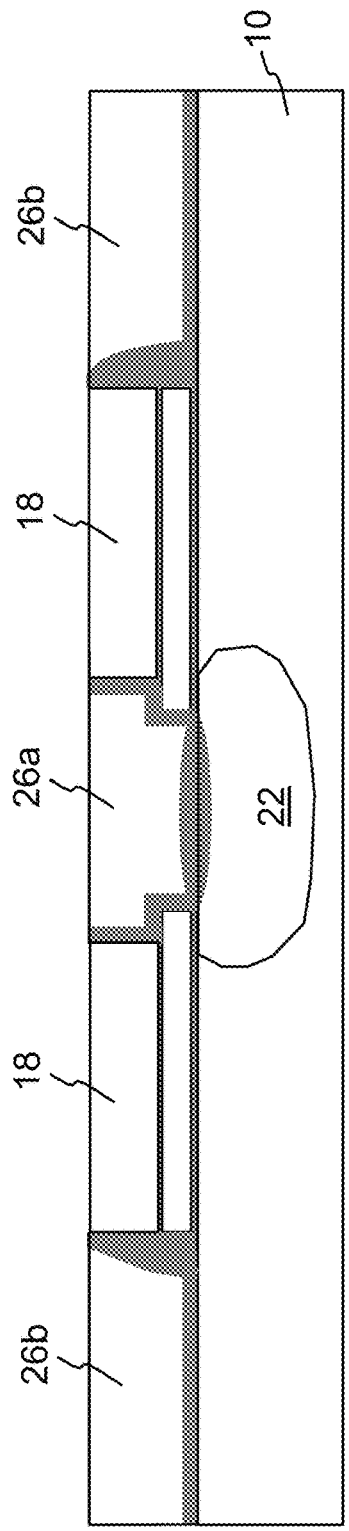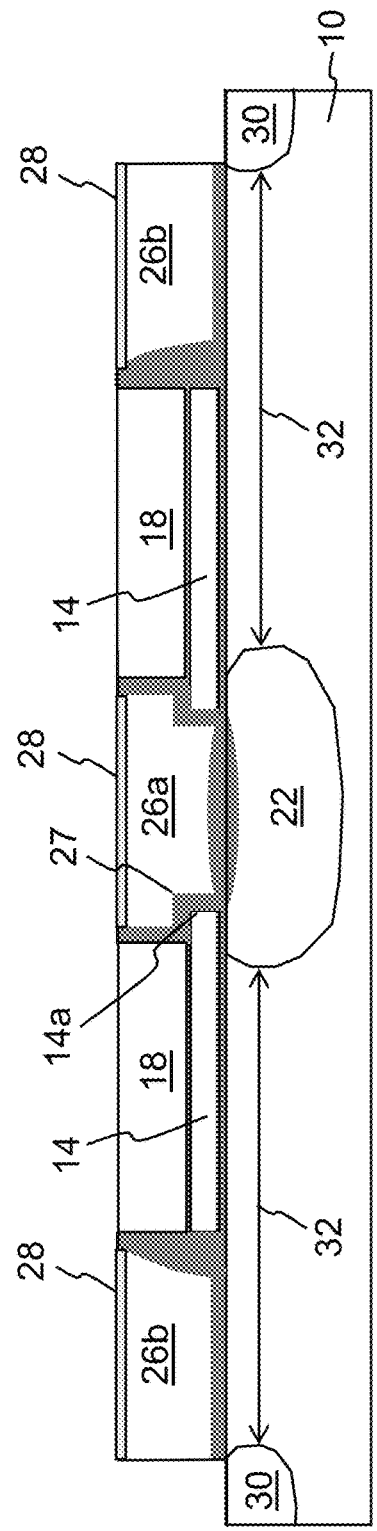

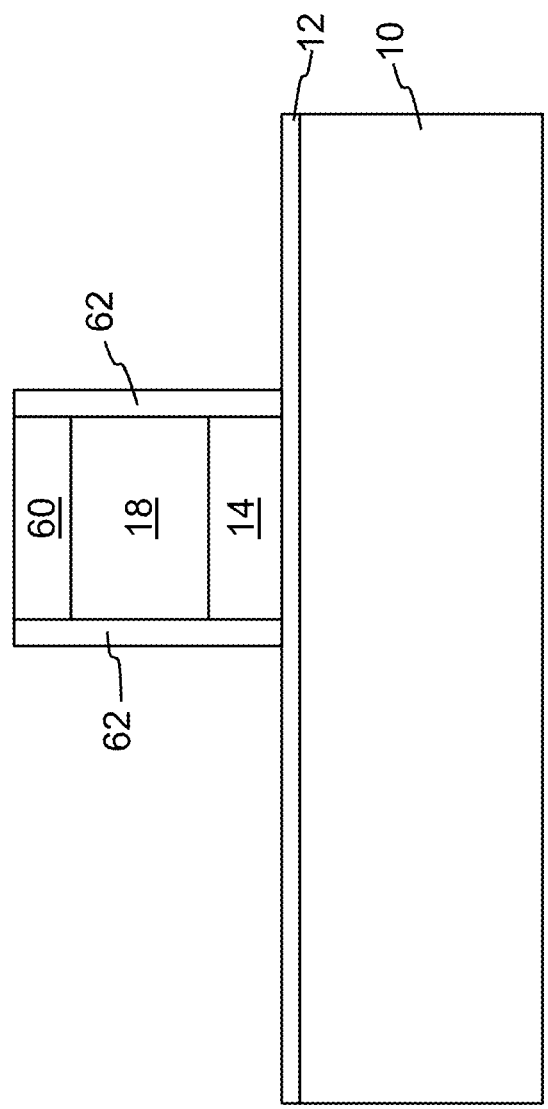

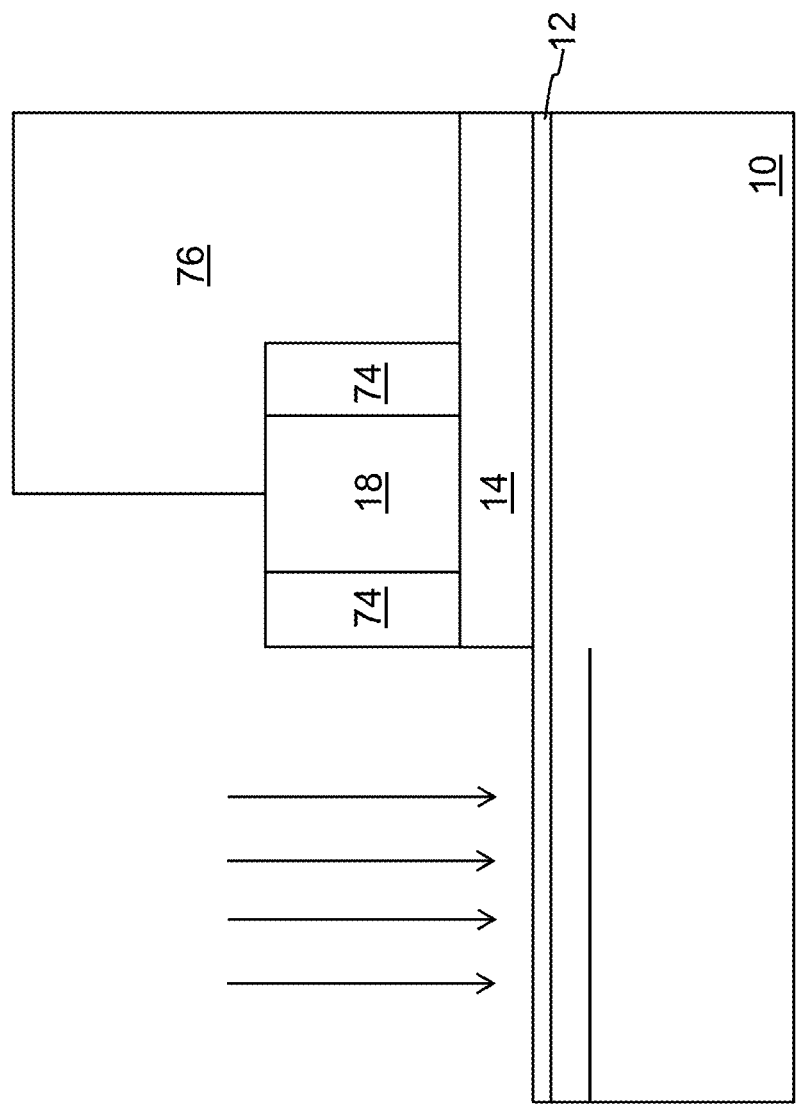

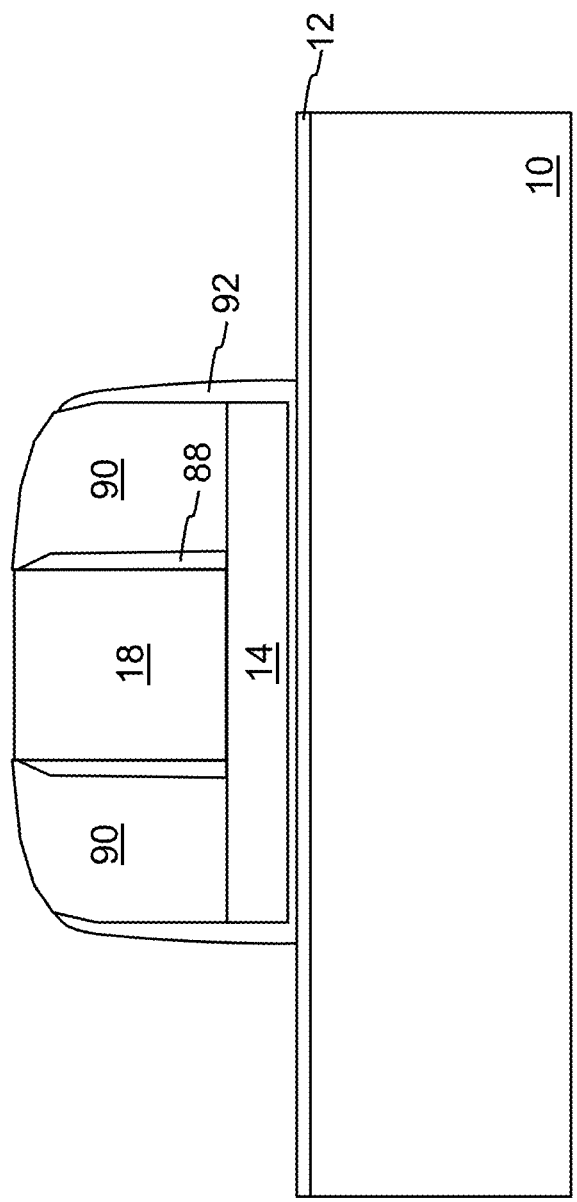

METHOD OF FORMING PAIRS OF THREE-GATE NON-VOLATILE FLASH MEMORY CELLS USING TWO POLYSILICON DEPOSITION STEPS

RELATED APPLICATION

This application claims the benefit of Chinese Patent Application No. 201610247666.6 filed on Apr. 20, 2016.

TECHNICAL FIELD

The present invention relates to a non-volatile flash memory cell which has a word line (WL) gate, a floating gate, and an erase gate.

BACKGROUND OF THE INVENTION

Split gate non-volatile flash memory cells having a word line (WL) gate, a floating gate, and an erase gate are well known in the art. See for example U.S. Pat. No. 7,315,056, which is incorporated herein by reference in its entirety.

As non-volatile memory cells have reduced in size, it becomes more challenging to fabricate such memory cells in terms of self-aligned elements, and reduced numbers of processing steps (e.g. masking steps, poly deposition steps, etc.). Accordingly, it is one of the objectives of the present invention to simplify the fabrication process as the memory cells continue to shrink in size.

SUMMARY OF THE INVENTION

A simplified method for forming a pair of non-volatile memory cells includes forming a first insulation layer on a semiconductor substrate, forming a first polysilicon layer on the first insulation layer in a first polysilicon deposition process, forming a pair of spaced apart insulation blocks on the first polysilicon layer, each of the insulation blocks having first sides facing toward each other and second sides facing away from each other, removing portions of the first polysilicon layer while maintaining portions of the first polysilicon layer disposed underneath the pair of insulation blocks and between the pair of insulation blocks, forming a pair of spaced apart insulation spacers adjacent the first sides and over a portion of the first polysilicon layer disposed between the pair of insulation blocks, removing a portion of the first polysilicon layer disposed between the insulation spacers while maintaining a pair of polysilicon blocks of the first polysilicon layer each disposed under one of the pair of insulation blocks and one of the pair of insulation spacers, forming a source region in the substrate and between the pair of insulation blocks, removing the pair of insulation spacers, forming insulation material that at least extends along an end portion of each of the pair of polysilicon blocks, forming a second polysilicon layer over the substrate and the pair of insulation blocks in a second polysilicon deposition process, removing portions of the second polysilicon layer while maintaining a first polysilicon block, a second polysilicon block and a third polysilicon block of the second polysilicon layer (wherein the first polysilicon block is disposed between the pair of insulation blocks and over the source region, the second polysilicon block is disposed adjacent the second side of one of the insulation blocks, and the third polysilicon block is disposed adjacent the second side of another one of the insulation blocks), forming a first drain region in the substrate and adjacent the second polysilicon block, and forming a second drain region in the substrate and adjacent the third polysilicon block.

A simplified method of forming a pair of non-volatile memory cells includes forming a first insulation layer on a semiconductor substrate, forming a first polysilicon layer on the first insulation layer in a first polysilicon deposition process, forming a pair of spaced apart insulation blocks on the first polysilicon layer, each of the insulation blocks having first sides facing toward each other and second sides facing away from each other, removing portions of the first polysilicon layer while maintaining a pair of polysilicon blocks of the first polysilicon layer each disposed under one of the pair of insulation blocks, forming insulation spacers adjacent the first and second sides, removing the insulation spacers adjacent the first sides, forming a source region in the substrate and between the pair of insulation blocks, forming a layer of insulation material that at least extends along the first sides and along the insulation spacers adjacent the second sides, forming a second polysilicon layer over the substrate and the pair of insulation blocks in a second polysilicon deposition process, removing portions of the second polysilicon layer while maintaining a first polysilicon block, a second polysilicon block and a third polysilicon block of the second polysilicon layer (wherein the first polysilicon block is disposed between the pair of insulation blocks and over the source region, the second polysilicon block is disposed adjacent the second side of one of the insulation blocks, and the third polysilicon block is disposed adjacent the second side of another one of the insulation blocks), forming a first drain region in the substrate and adjacent the second polysilicon block, and forming a second drain region in the substrate and adjacent the third polysilicon block.

A simplified method of forming a pair of non-volatile memory cells includes forming a first insulation layer on a semiconductor substrate, forming a first polysilicon layer on the first insulation layer in a first polysilicon deposition process, forming a pair of spaced apart insulation blocks on the first polysilicon layer, each of the insulation blocks having first sides facing toward each other and second sides facing away from each other, forming insulation spacers adjacent the first and second sides, reducing a width of the insulation spacers adjacent the first sides, removing portions of the first polysilicon layer while maintaining a pair of polysilicon blocks of the first polysilicon layer each disposed under one of the pair of insulation blocks and the insulation spacers adjacent the first and second sides of the one insulation block, forming a source region in the substrate and between the pair of insulation blocks, removing the insulation spacers to expose end portions of each of the pair of polysilicon blocks of the first polysilicon layer, forming a layer of insulation material that at least extends along the exposed end portions of each of the pair of polysilicon blocks of the first polysilicon layer, forming a second polysilicon layer over the substrate and the pair of insulation blocks in a second polysilicon deposition process, removing portions of the second polysilicon layer while maintaining a first polysilicon block, a second polysilicon block and a third polysilicon block of the second polysilicon layer (wherein the first polysilicon block is disposed between the pair of insulation blocks and over the source region, the second polysilicon block is disposed adjacent the second side of one of the insulation blocks, and the third polysilicon block is disposed adjacent the second side of another one of the insulation blocks), forming a first drain region in the substrate and adjacent the second polysilicon block, and forming a second drain region in the substrate and adjacent the third polysilicon block.

A simplified method of forming a pair of non-volatile memory cells includes forming a first insulation layer on a semiconductor substrate, forming a first polysilicon layer on the first insulation layer in a first polysilicon deposition process, forming an insulation block on the first polysilicon layer having opposing first and second sides, forming a first insulation spacer on the first polysilicon layer and adjacent the first side and a second insulation spacer on the first polysilicon layer and adjacent the second side, removing portions of the first polysilicon layer while maintaining a polysilicon block of the first polysilicon layer disposed under the insulation block and first and second insulation spacers, removing the insulation block, removing a portion of the first polysilicon layer disposed between the first and second insulation spacers to form a first polysilicon block of the first polysilicon layer disposed under the first insulation spacer and a second polysilicon block of the first polysilicon layer disposed under the second insulation spacer, forming a source region in the substrate and between the first and second insulation spacers, forming insulation material that at least extends along an end portion of each of the first and second polysilicon blocks of the first polysilicon layer, forming a second polysilicon layer over the substrate and the pair of insulation spacers in a second polysilicon deposition process, removing portions of the second polysilicon layer while maintaining a third polysilicon block, a fourth polysilicon block and a fifth polysilicon block of the second polysilicon layer (wherein the third polysilicon block is disposed between the pair of insulation spacers and over the source region, the fourth polysilicon block is disposed adjacent the first insulation spacer, and the fifth polysilicon block is disposed adjacent the second insulation spacer), forming a first drain region in the substrate and adjacent the fourth polysilicon block, and forming a second drain region in the substrate and adjacent the fifth polysilicon block.

Other objects and features of the present invention will become apparent by a review of the specification, claims and appended figures.

BRIEF DESCRIPTION OF THE DRAWINGS

FIGS. 1A-1I are cross sectional views illustrating steps in forming a pair of memory cells of the present invention.

FIGS. 3A-3D are cross sectional views illustrating steps in another alternate embodiment for forming a pair of memory cells of the present invention.

FIGS. 4A-4D are cross sectional views illustrating steps in another alternate embodiment for forming a pair of memory cells of the present invention.

FIGS. 5A-5C are cross sectional views illustrating steps in another alternate embodiment for forming a pair of memory cells of the present invention.

DETAILED DESCRIPTION OF THE INVENTION

Figure 1E:
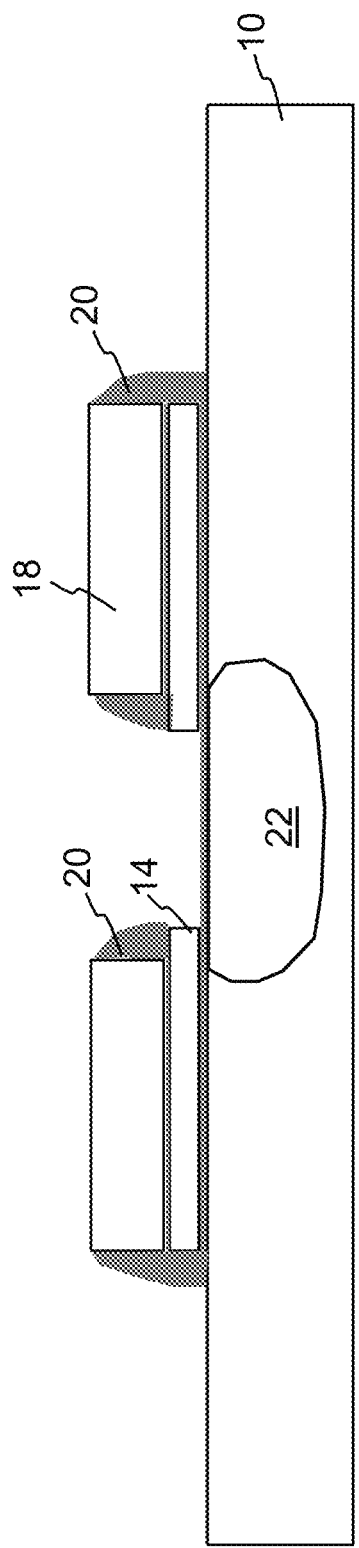

The present invention is a method of making pairs of memory cells with a reduced numbers of processing steps (e.g. only two polysilicon deposition steps). Referring to FIGS. 1A-1I, there are shown cross-sectional views of the steps in the process to make pairs of memory cells (while only the formation of a single pair of memory cells are shown in the figures, it should be understood that an array of such memory cell pairs are formed concurrently). The process begins by forming a layer of silicon dioxide (oxide) 12 on a substrate 10 of P type single crystalline silicon. The oxide layer 12 can be 80-100 A thick. Thereafter a layer 14 of polysilicon (or amorphous silicon) is formed on the layer 12 of silicon dioxide. Poly layer 14 can be 200-300 A thick. Another insulating layer 16 (e.g. oxide) is formed on poly layer 14, and yet another insulating layer 18 (e.g. silicon nitride (nitride)) is formed on oxide layer 16, as shown in FIG. 1A. Oxide layer 16 can be 20-50 A thick, and nitride layer 18 can be about 500 A thick.

Photoresist material (not shown) is coated on the structure, and a masking step is performed exposing selected portions of the photoresist material. The photoresist is developed such that portions of the photoresist are removed. Using the remaining photoresist as a mask, the structure is etched. Specifically, nitride and oxide layers 18 and 16 are anisotropically etched (using poly layer 14 as an etch stop), leaving pairs of nitride blocks 18 as shown in FIG. 1B (after the photoresist is removed). The space between nitride blocks 18 is termed herein the "inner region," and the spaces outside of the pair of nitride blocks are termed herein the "outer regions." Photoresist material is again coated on the structure, and is patterned using masking and develop steps, to cover the inner region. An anisotropic poly etch is then used to remove those portions of poly layer 14 in the outer regions, as shown in FIG. 1C (after the photoresist is removed).

Oxide spacers 20 are then formed on the sides of the structure. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). The resultant structure is shown in FIG. 1D. A poly etch is then used to remove the exposed portion of poly layer 14 in the inner region. An implant process (e.g. implantation and anneal) is then performed to form source region 22 in the substrate in the inner region. The resulting structure is shown in FIG. 1E.

Figure 1F:
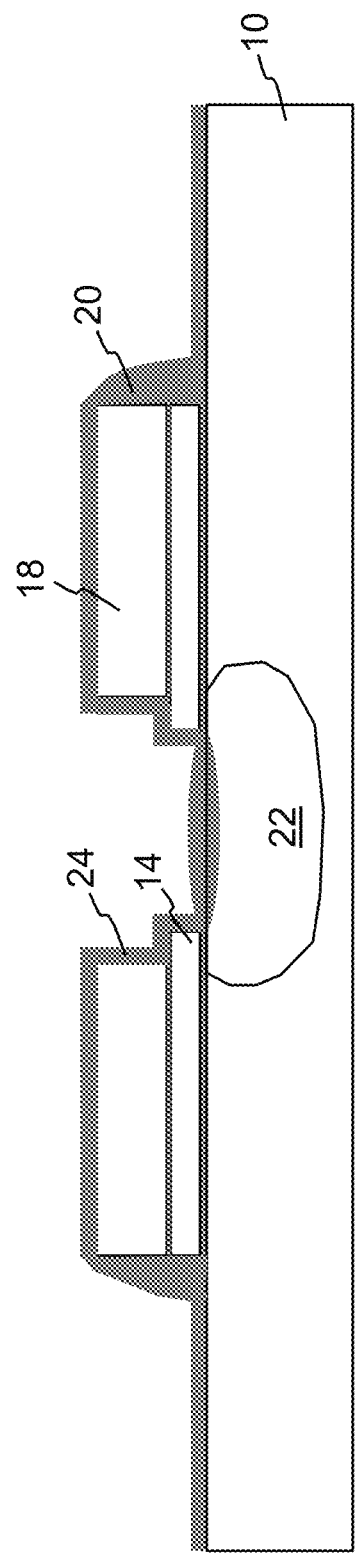
Figure 1G:
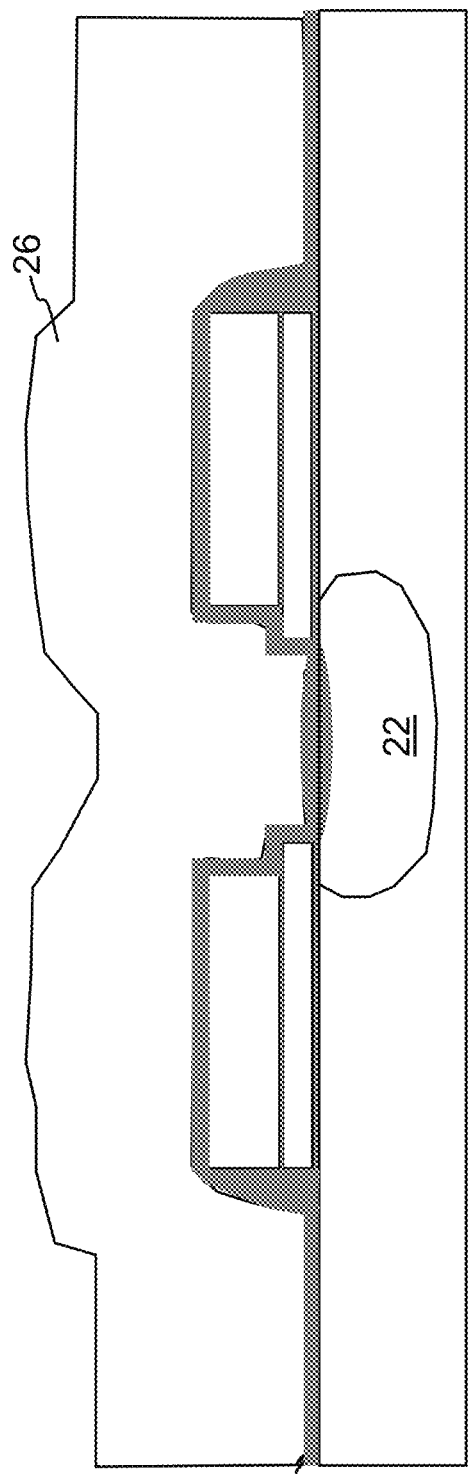

Photoresist is formed on the structure and removed from the inner region, and an oxide etch is used to remove the oxide spacers 20 in the inner region and the oxide layer 12 over the source region. After photoresist removal, a tunnel oxide layer 24 is then formed over the structure (e.g. by high temperature oxide HTO), including the exposed portions of poly layer 14 in the inner region, as shown in FIG. 1F. A thick layer 26 of polysilicon is formed over the structure (see FIG. 1G), followed by a poly etch (e.g. CMP using nitride 18 as an etch stop), leaving a poly block 26a in the inner region and poly blocks 26b in the outer regions, as shown in FIG. 1H. An optional poly etch could be used to reduce the height of poly blocks 26a and 26b (i.e. below the tops of nitride blocks 18).

Photoresist is formed on the structure and patterned to leave portions of poly blocks 26b exposed, followed by a poly etch to remove exposed portions of poly blocks 26 (i.e. to define the outside edges of poly blocks 26b). An implant is then performed to form drain regions 30 in the substrate adjacent the outside edges of poly blocks 26b. Salicide 28 is then formed on the exposed upper surfaces of poly blocks 26a and 26b (for improved conductivity). The final structure is shown in FIG. 1I, and includes a pair of memory cells. Each memory cell includes a source region 22, a drain region 30, a channel region 32 in the substrate between the source and drain regions, a floating gate 14 disposed over and insulated from a first portion of the channel region 32, a word line gate 26b disposed over and insulated from a second portion of the channel region 32, and an erase gate 26a disposed over and insulated from the source region 22. The erase gate 26a has a first portion that is laterally adjacent to the floating gate 14 and a second portion that extends up and over a portion of the floating gate 14.

The above described manufacturing method has several advantages. First, only two poly depositions are used to form all three gates (floating 14, erase 26a and word line 26b). The floating gate 14 has a sharp tip or edge 14a facing a notch 27 in the erase gate 26a for improved erase efficiency. The floating gate 14 is relatively thin, while the nitride block 18 above the floating gate 14 is relatively thick and acts as a reliable hard mask and serves as a poly CMP stop layer.

Referring to FIGS. 2-7, there are shown cross-sectional views of alternate embodiments of the process to make pairs of memory cells (while only the formation of one memory cell is shown in these figures, it should be understood that a mirror memory cell is concurrently formed on the other side of the source region as part of a pair of memory cells, and that an array of such memory cell pairs are formed concurrently).

Figure 2:
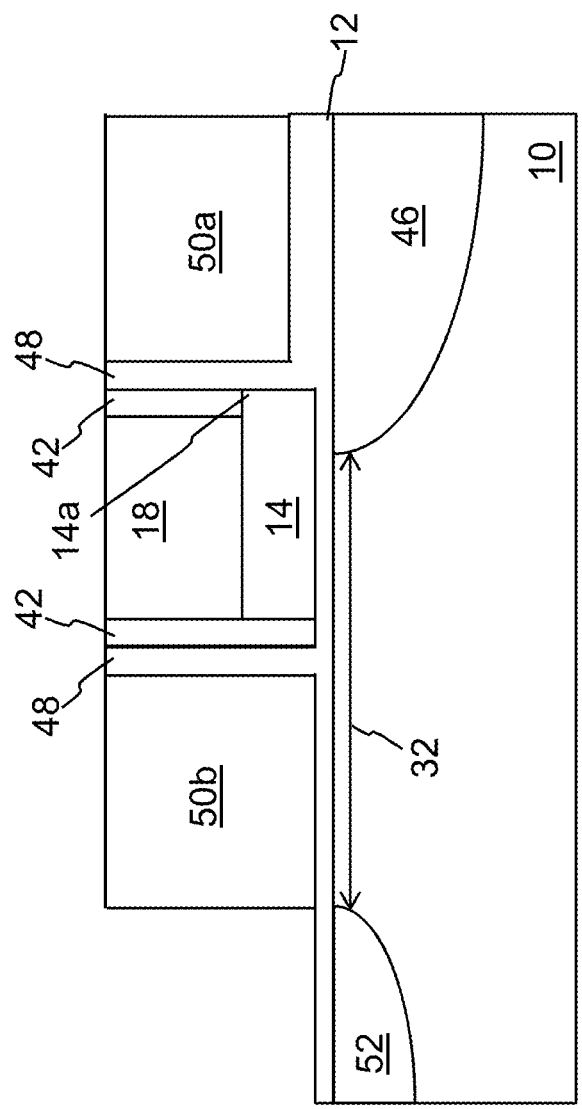
FIG. 2 is a cross sectional view of another alternate embodiment for forming a pair of memory cells of the present invention.

FIG. 2 illustrates an alternate embodiment of the process of FIGS. 1A-1I, wherein the spacer 42 formed over floating gate 14 in the inner region is left remaining before the formation of erase gate 50a (i.e., no inner region oxide etch), to simplify the fabrication process.

Figure 3A:
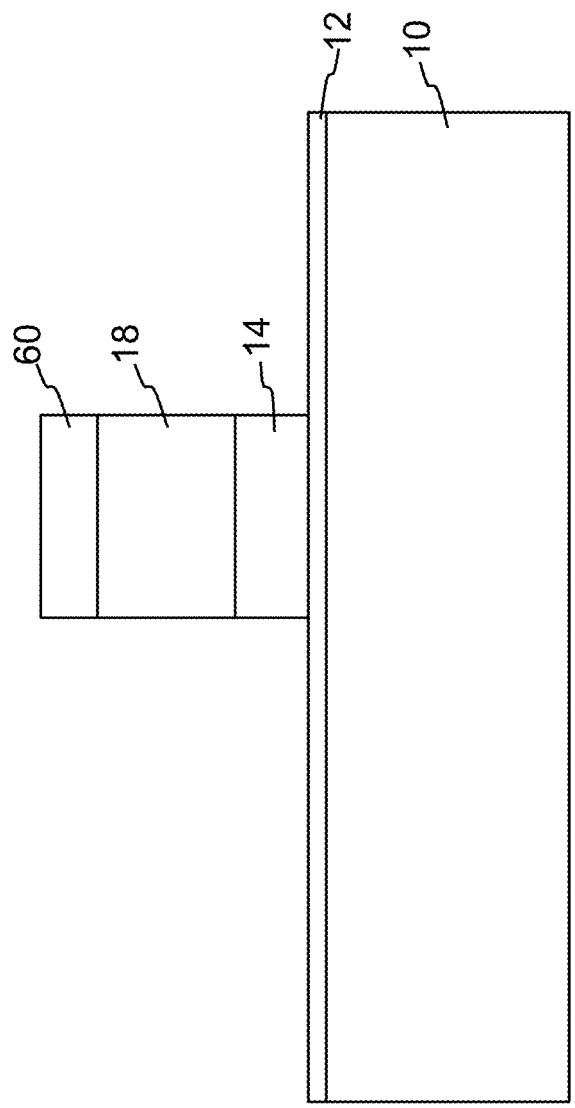
Figure 3C:
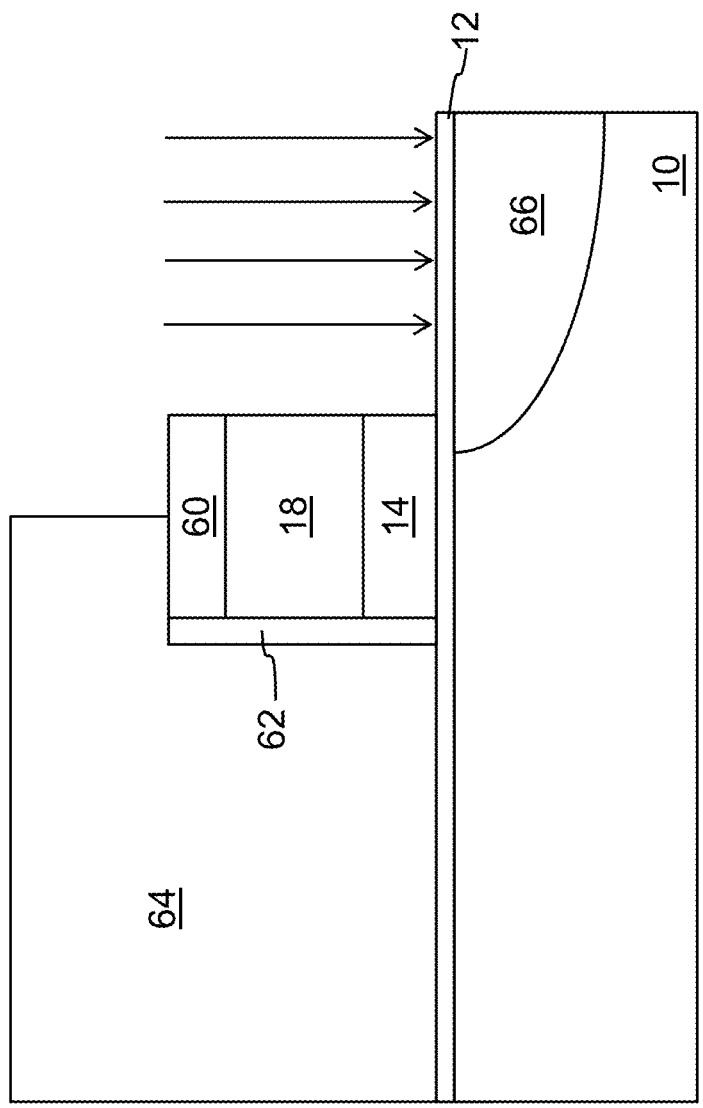
Figure 3D:
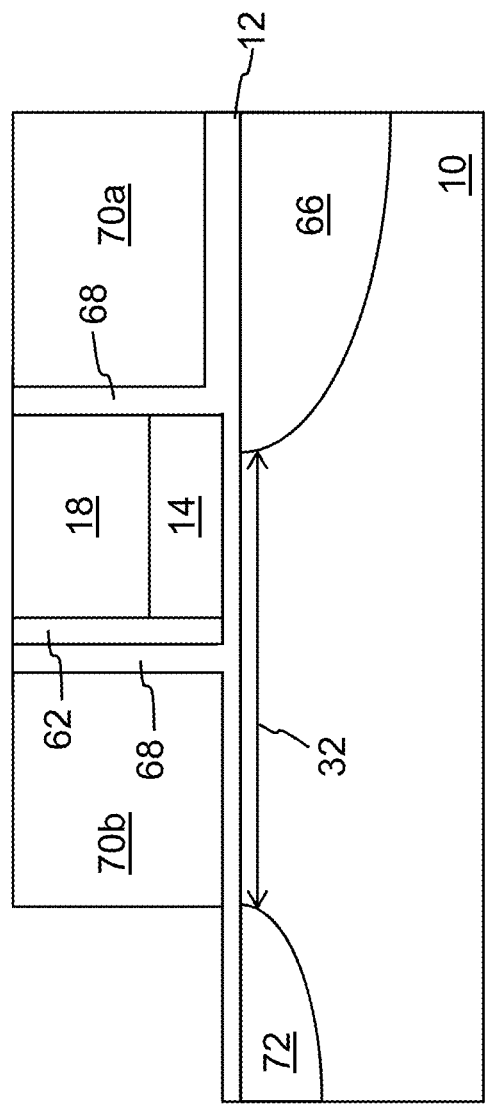

FIGS. 3A-3D illustrate yet another alternate embodiment of the process of FIGS. 1A-1I, wherein the process begins with the same processing steps described above and illustrated in FIG. 1A. However, unlike the poly etch that only removes the exposed portions of poly layer 14 in the outer regions as shown in FIG. 1C, a poly etch is used to remove the poly layer 14 in both the inner and outer regions as shown in FIG. 3A. Preferably, an additional oxide layer 60 is formed on nitride blocks 18. Insulation spacers 62 (e.g. composite, formed of both oxide and nitride, or just oxide) are formed along the sides of nitride block 18 and poly layer 14, as shown in FIG. 3B. Photoresist 64 is formed on the structure, and removed from the inner region. The exposed ON or oxide spacer 62 is removed by nitride/oxide etch. An implant process is then used to form source region 66, as shown in FIG. 3C. After photoresist removal, an oxide layer 68 is formed over the structure. A poly deposition, CMP and poly etch are then performed to form the erase gate 70a and word line gate 70b. An implant is then used to form drain 72. The final structure is shown in FIG. 3D. With this embodiment, the spacing between the erase gate 70a and the floating gate 14 and nitride block 18 is dictated solely by oxide layer 68.

Figure 4B:
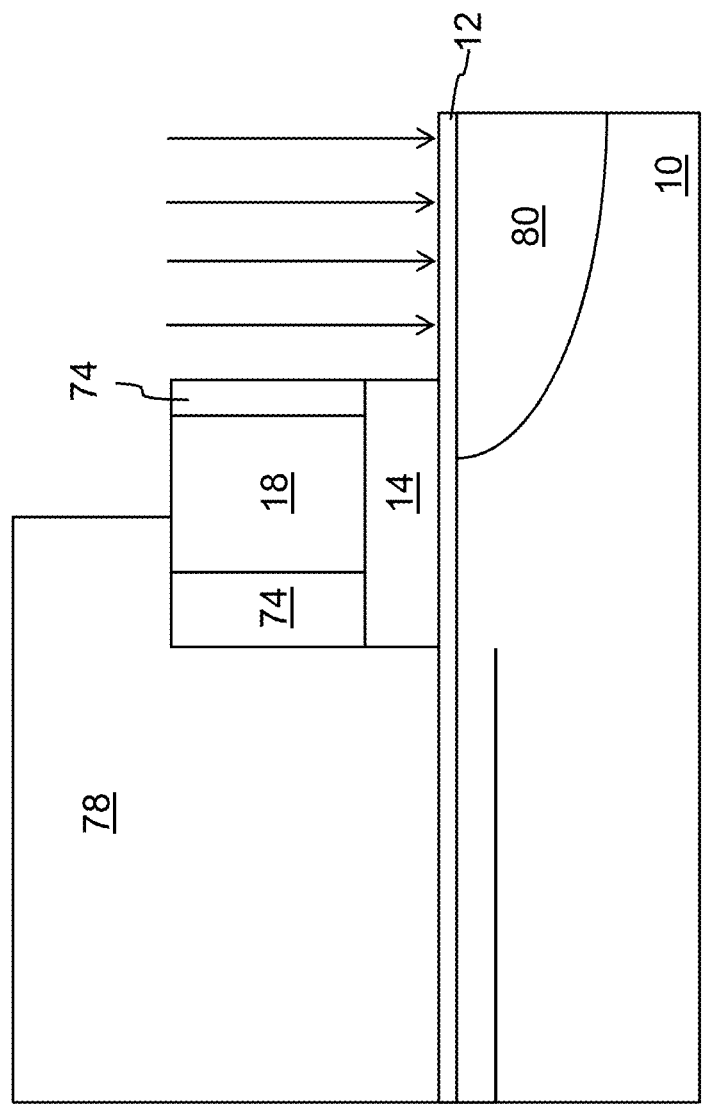
Figure 4C:
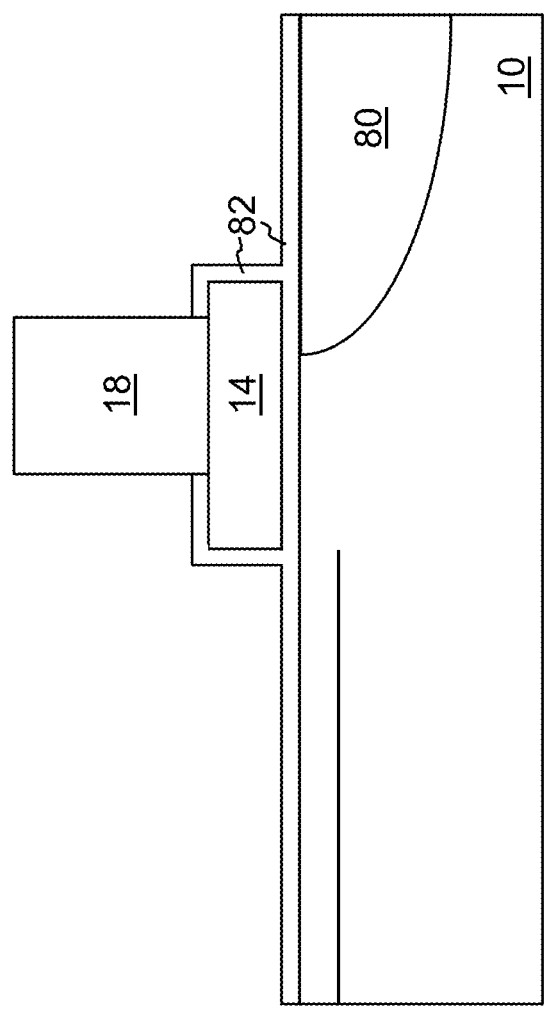
Figure 4D:
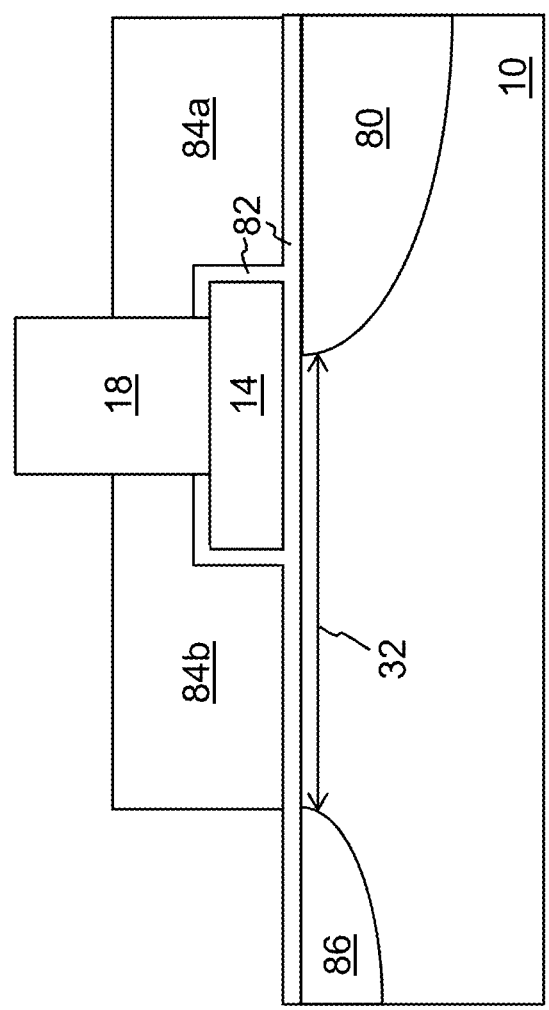

FIGS. 4A-4D illustrate yet another alternate embodiment of the process of FIGS. 1A-1I, wherein the process begins with the same processing steps described above and illustrated in FIG. 1A. Spacers 74 of insulation material (e.g. oxide) are formed on both sides of nitride block 18. Photo resist 76 is formed on the structure, and selectively removed from the outer regions. A poly etch is used to remove the exposed portions of poly layer 14. A WLVT implantation is used to implant the substrate in the outer regions, as illustrated in FIG. 4A. After photoresist removal, photoresist 78 is formed on the structure, and selectively removed from the inner region. An oxide wet etch is performed to thin the exposed spacers 74 in the inner region (to independently control the eventual overlap of the erase gate and the floating gate). A poly etch is then performed to remove the exposed portions of poly layer 14 in the inner region. An implant process is then performed to form source region 80, as shown in FIG. 4B. After photoresist removal, an oxide etch is performed to remove spacers 74 and exposed portions of oxide layer 12. A thermal oxidation process is used to form oxide layer 82 on the exposed surfaces of poly layer 14 and substrate 10, as illustrated in FIG. 4C. A poly deposition and etch are used to form erase gate 84a and word line gate 84b, and an implant is used to form drain region 86, as illustrated in FIG. 4D. Both the erase gate 84a and word line gate 84b have a first portion laterally adjacent to the floating gate and a second portion extending up and over the floating gate, for enhanced erase efficiency and capacitive coupling. The amount of floating gate overlap by the erase gate relative to the word line gate is independently controlled and dictated by the oxide spacer thinning step.

Figure 5A:
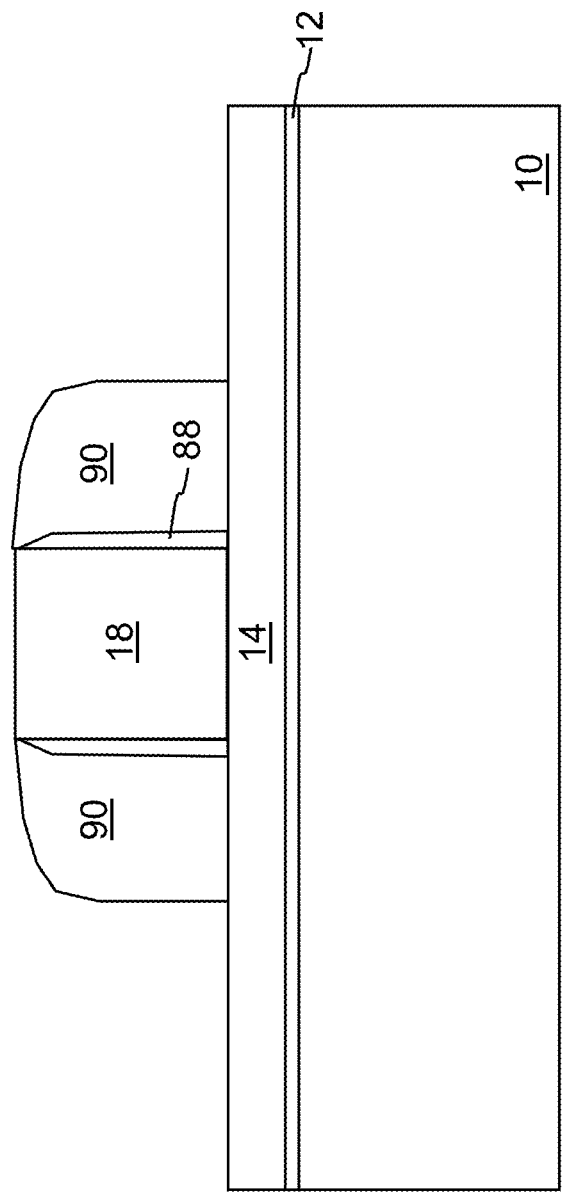
Figure 5C:
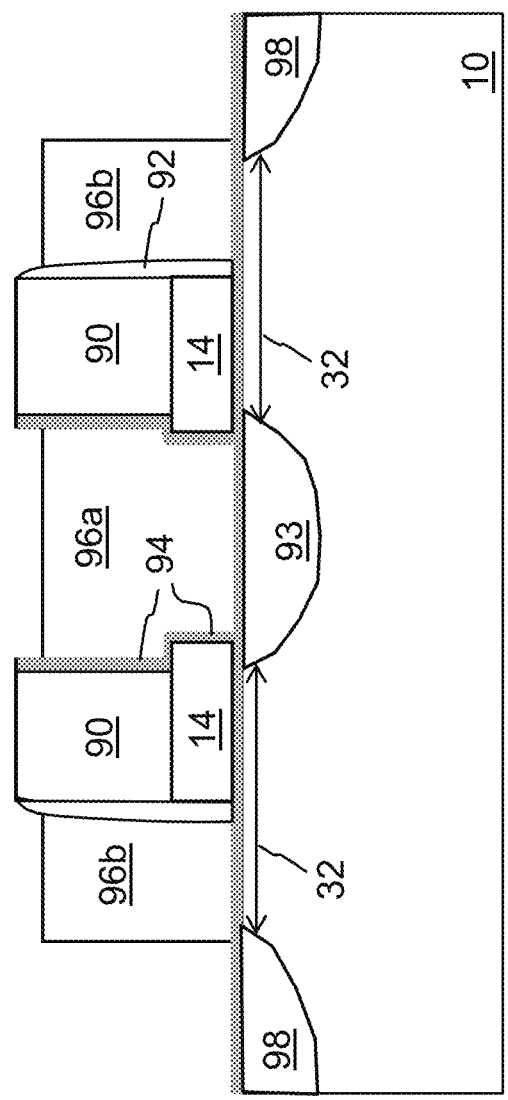

FIGS. 5A-5C illustrate yet another alternate embodiment of the process of FIGS. 2A-1I, wherein the process begins with the same processing steps described above and illustrated in FIG. 1A. However, in this embodiment, the erase gate replaces nitride block 18 instead of being formed next to it. Specifically, spacers 88 (optional) and 90 of insulation material (e.g. oxide-nitride for spacers 88 which is optional, and oxide for spacers 90) are formed on both sides of nitride block 18, as illustrated in FIG. 5A. A poly etch is used to remove those portions of poly layer 14 not protected by nitride block 18 and spacers 88 and 90. Spacers 92 of insulation material (e.g. oxide) are then formed on the sides of the structure, including the exposed ends of poly layer, as illustrated in FIG. 5B. A nitride etch is used to remove nitride block 18 leaving a trench behind and exposing a portion of the poly layer 14 at the bottom of the trench. A poly etch is used to remove the exposed portion of poly layer 14. An implant process is used to form source region 93. Spacers 88 are removed or thinned, or spacer 90 is thinned without optional spacer 88, and oxide 94 is formed along the sidewalls of the trench left behind by the removal of nitride block 18. A poly deposition and etch are performed to form erase gate 96a and word line gates 96b. An implant process is then used to form drain regions 98. The resulting structure is shown in FIG. 5C.

Figure 6:
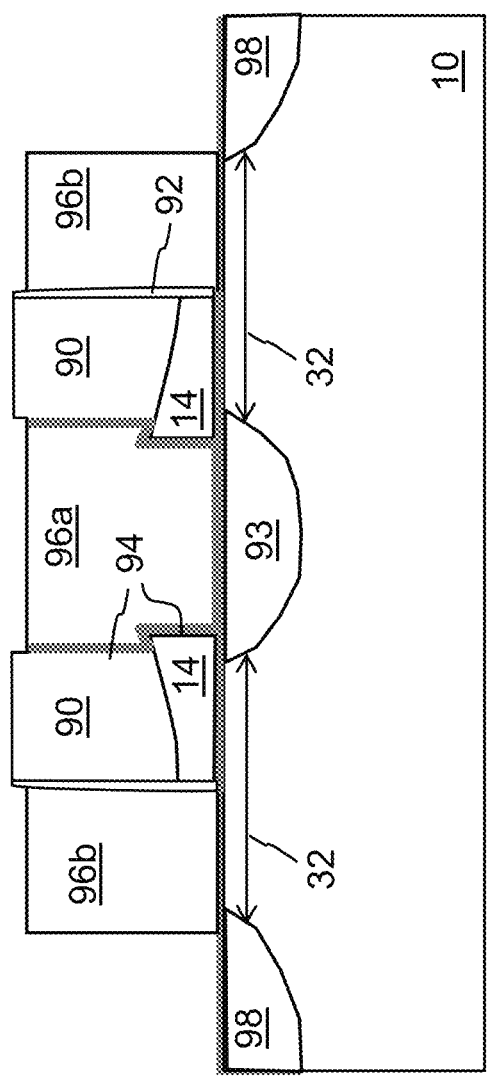
FIG. 6 is a cross sectional view of another alternate embodiment for forming a pair of memory cells of the present invention.

FIG. 6 illustrates an alternate embodiment of the process of FIGS. 5A-5C, wherein before spacers 90 are formed, a poly slope etch is performed so that the upper surface of poly layer 14 slopes downwardly as it extends away from nitride block 18. This results in each floating gate having an upwardly sloping surface terminating in a sharper edge that faces the notch of the erase gate.

Figure 7:
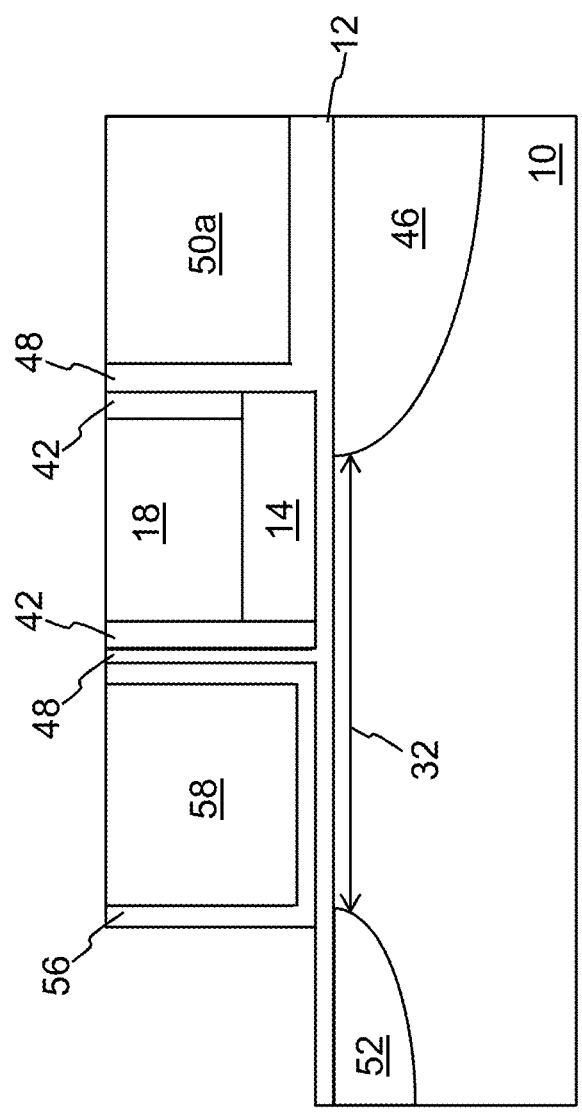
FIG. 7 is a cross sectional view of another alternate embodiment for forming a pair of memory cells of the present invention.

FIG. 7 illustrates another alternate embodiment of the processes of FIGS. 1-6, wherein the poly block that forms the word line gate is removed by poly etch, and replaced with an insulation layer of a high K material (i.e. having a dielectric constant K greater than that of oxide, such as HfO2, ZrO2, TiO2, etc.), and a block of metal material. For example, with respect to the embodiment of FIG. 2, poly block 50b is removed by poly etch, and replaced with an insulation layer 56 of a high K material and a block 58 of metal material, as shown in FIG. 7. By having the word line gate 58 formed of metal, greater gate conductivity can be achieved. The same can be done for poly block 26b in FIG. 1I, poly block 70b in FIG. 3D, poly block 84b in FIG. 4D, and poly block 96b in FIGS. 5C and 6.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. For example, nitride blocks 18 could instead be made of oxide or composite layers with oxide-nitride-oxide, or oxide-nitride. The insulator under the word line gates 26b, 50b, 70b, 84b, and 96b can be silicon oxide, or nitrogen treated oxide with NO, N2O anneal or DPN (decoupled plasma nitridation), and is not limited to these examples. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a pair of non-volatile memory cells comprising:
   forming a first insulation layer on a semiconductor substrate;
   forming a first polysilicon layer on the first insulation layer in a first polysilicon deposition process;
   forming a pair of spaced apart insulation blocks directly on the first polysilicon layer, each of the insulation blocks having first sides facing toward each other and second sides facing away from each other;
   removing portions of the first polysilicon layer while maintaining portions of the first polysilicon layer disposed underneath the pair of insulation blocks and between the pair of insulation blocks;
   forming a pair of spaced apart insulation spacers adjacent the first sides and over a portion of the first polysilicon layer disposed between the pair of insulation blocks, wherein the forming of the insulation spacers includes removing portions of the first insulation layer adjacent the second sides;
   removing a portion of the first polysilicon layer disposed between the insulation spacers while maintaining a pair of polysilicon blocks of the first polysilicon layer each disposed under one of the pair of insulation blocks and one of the pair of insulation spacers;
   forming a source region in the substrate and between the pair of insulation blocks;
   removing the pair of insulation spacers;
   forming insulation material that at least extends along an end portion of each of the pair of polysilicon blocks and along portions of the semiconductor substrate adjacent the second sides;
   forming a second polysilicon layer over the substrate and the pair of insulation blocks in a second polysilicon deposition process;
   removing portions of the second polysilicon layer while maintaining a first polysilicon block, a second polysilicon block and a third polysilicon block of the second polysilicon layer, wherein:
      the first polysilicon block is disposed between the pair of insulation blocks and over the source region,
      the second polysilicon block is disposed adjacent the second side of one of the insulation blocks, and
      the third polysilicon block is disposed adjacent the second side of another one of the insulation blocks,
      wherein the removing of the portions of the second polysilicon layer includes performing a CMP using the pair of insulation blocks as an etch stop to planarize top surfaces of the first, second and third polysilicon blocks;
   forming a first drain region in the substrate and adjacent the second polysilicon block; and
   forming a second drain region in the substrate and adjacent the third polysilicon block.

2. The method of claim 1, further comprising:
   forming salicide on upper surfaces of the first, second and third polysilicon blocks.

3. The method of claim 1, wherein the first polysilicon block includes a first portion laterally adjacent to the pair of polysilicon blocks of the first polysilicon layer, and a second portion that extends up and over the pair of polysilicon blocks of the first polysilicon layer.

4. The method of claim 1, further comprising:
   forming a pair of second insulation spacers adjacent the second sides in a same deposition and etch process used to form the pair of spaced apart insulation spacers.

5. The method of claim 1, wherein the spaced apart insulation blocks are formed of oxide, or a composite of layers including both oxide and nitride.

6. The method of claim 1, wherein the first insulation layer is formed of oxide or nitrogen treated oxide.

* * * * *